(12) United States Patent
Vanalli et al.

(10) Patent No.: US 9,183,941 B2
(45) Date of Patent: *Nov. 10, 2015

(54) THERMAL TREATMENT OF FLASH MEMORIES

(71) Applicant: Micron Technology, Inc., Boise, ID (US)

(72) Inventors: Gian Pietro Vanalli, S. Bartolomeo (IT); Stefano Corno, Caponago (IT); Giovanni Campardo, Bergamo (IT); Angelo Visconti, Appiano Gentile (IT); Silvia Beltrami, Bartolomeo (IT); Alexey Petrushin, Milan (IT)

(73) Assignee: Micron Technology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 14/584,628

(22) Filed: Dec. 29, 2014

(65) Prior Publication Data

US 2015/0114946 A1    Apr. 30, 2015

Related U.S. Application Data

(63) Continuation of application No. 13/101,322, filed on May 5, 2011, now Pat. No. 8,958,242.

(51) Int. Cl.

| G11C 11/34 | (2006.01) |
| G11C 11/00 | (2006.01) |
| H05B 3/00 | (2006.01) |
| H01L 23/34 | (2006.01) |
| G11C 16/34 | (2006.01) |
| G11C 16/26 | (2006.01) |

(52) U.S. Cl.
CPC .............. *G11C 16/26* (2013.01); *G11C 11/00* (2013.01); *G11C 16/3418* (2013.01); *G11C 16/3427* (2013.01); *G11C 16/3431* (2013.01); *H01L 23/345* (2013.01); *H05B 3/00* (2013.01); *H01L 2924/0002* (2013.01)

(58) Field of Classification Search
CPC .................................................. G11C 16/3418
USPC .................................................... 365/185.02
See application file for complete search history.

(56) References Cited

U.S. PATENT DOCUMENTS

| 7,347,621 B2 | 3/2008 | Sri-Jayantha et al. |
| 7,395,176 B2 | 7/2008 | Chung et al. |
| 2003/0214316 A1 | 11/2003 | Maggi et al. |
| 2010/0025811 A1 | 2/2010 | Bronner et al. |
| 2010/0064096 A1 | 3/2010 | Weingarten et al. |
| 2010/0165689 A1 | 7/2010 | Rotbard et al. |
| 2010/0230807 A1 | 9/2010 | Bronner et al. |
| 2011/0110158 A1 | 5/2011 | Schuette |
| 2011/0299317 A1 | 12/2011 | Shaeffer et al. |

OTHER PUBLICATIONS

Office Action of the Intellectual Property Office for TW application No. 101116114 issued Oct. 20, 2014.
International Search Report and Written Opinion mailed Dec. 6, 2012 for Appl No. PCT/US2012/036420.

(Continued)

*Primary Examiner* — Huan Hoang
*Assistant Examiner* — Tri Hoang
(74) *Attorney, Agent, or Firm* — Dorsey & Whitney LLP

(57) ABSTRACT

A memory controller can provide current to a heater in a flash memory to reduce cycling induced errors. If necessary, after heating, the memory may be refreshed. In non-battery powered systems, data may be removed from the memory prior to heating and restored to the memory after heating.

20 Claims, 4 Drawing Sheets

THERMAL TREATMENT OF FLASH MEMORIES

CROSS-REFERENCE TO RELATED APPLICATION

This application is a continuation of U.S. patent application Ser. No. No. 13/101,322, filed May 5, 2011, issued as U.S. Pat. No. 8,958,242 on Feb. 17, 2015; which application is hereby incorporated by reference therein, in its entirety, for any purpose.

BACKGROUND

This relates generally to flash memories and, particularly, to techniques for thermally treating a flash memory to improve its cycling lifetime.

When flash memories are repeatedly programmed and erased, they may have a tendency to lose data. Cycling of the memory induces the formation of charge traps in an oxide below the floating gate. These charge traps trap electrons during programming and erase operations. These trapped electrons can be released during the storage time of the device. The more the memory is used to recycle, the more trapped electrons may exist and the more prone the device may be to cycling induced failures.

More particularly, after cycling, electrons previously trapped in the tunnel oxide may be released with appropriate activation energy. This mechanism is commonly known as detrapping. The detrapping originates a threshold voltage negative shift so that cells in the so-called zero state move to the read level and can fail. The shift depends on the amount of electrons trapped during cycling, so the higher the quantity of trapped electrons, the higher the threshold shift. The higher the shift, the higher the probability that the stored information will be lost.

DETAILED DESCRIPTION

The useful life of a flash memory may be increased by providing a heater within the memory package to provide controlled application of heat under particular conditions to detrap trapped electrons from the tunnel oxide and then to reduce the total charge trapped due to memory cycling.

In some embodiments, the detrapping may be initiated during time periods when the memory is coupled to a wired power supply, as opposed to being battery power supplied. In some embodiments, the memory may not be used during such heating cycles.

Figure 1:
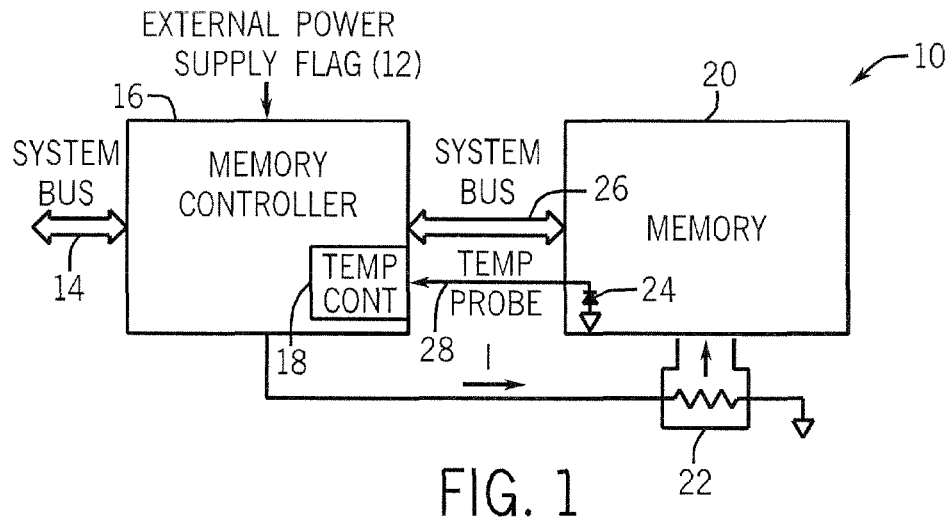
FIG. 1 is a schematic depiction of a memory system in accordance with one embodiment.

Thus, referring to FIG. 1, the flash memory 20 may include an internal heater 22, such as a Joule heater. The heater may receive current from a memory controller 16 which, in one embodiment, may be coupled directly to a power supply (not shown). When external power is supplied, a flag may be set, as indicated at 12, allowing the memory controller to use its temperature controller 18 to generate current I to heat the memory 20 using the heater 22. Normally the memory controller supplies information and receives data from the memory over a system bus 26 and provides the data to external components over a system bus 14.

The heater 22 may be a discrete device within the package of the memory 20 in one embodiment. In another embodiment, the heater may be integrated in the same die with the memory 20. The controller may be integrated in the same chip as the memory array or integrated separately. The controller and the memory may be in the same or separate packages.

Generally, the applied temperature may be sensed by an in-package temperature probe 24 which supplies information over the connection 28 to the temperature controller 18 which, in turn, regulates the flow of current to the heater 22 to achieve a desired temperature.

In some cases, excessive temperatures may be avoided because they may actually cause deleterious effects. In some embodiments, the heater may generate a temperature of from 120° C. to 150° C. for a few hours within the memory 20 package.

The memory controller 16 may be programmed to deactivate the memory 20 and to prevent user access upon detection of a temperature treatment initiating triggering event. The triggering event may be an indication that the system is coupled to external power supply and is currently inactive. It may also be triggered by a user command. In still another embodiment, it may be triggered at periodic time intervals.

In response to the event, the memory controller operates its temperature controller 18 to heat the memory 20 using the heater 22 until a desired temperature range sensed by the temperature sensor 24 is reached. This temperature is maintained for a desired amount of time, normally, on the order of a few hours. After this has been completed, the memory cells are read and data refreshed as needed to overcome any effects of data loss. The operation may terminate when the process is finished after a predefined time when any adjustments have been made or upon user request. In such case, a table with the status of the memory blocks that were processed can be stored in a dedicated area of the memory.

The heating operations may be done on specific marked blocks within a multi-block memory. In one embodiment, the blocks may be tracked based on age of the blocks since the last thermal treatment. Alternatively, the entire memory may be treated at one time.

In wireless battery based systems, the thermal treatment may implemented during battery charging. Alternatively, the heating may done in system defined time slots, at particular times of day, or when memory accessing operations reach a particularly low level. In some cases, other memory may be used in place of the memory being thermally treated. For example, some data may be moved from one memory to be treated to another memory not yet subject to such treatment. The user may then be blocked from accessing the heated memory during the treatment period.

Figure 2:
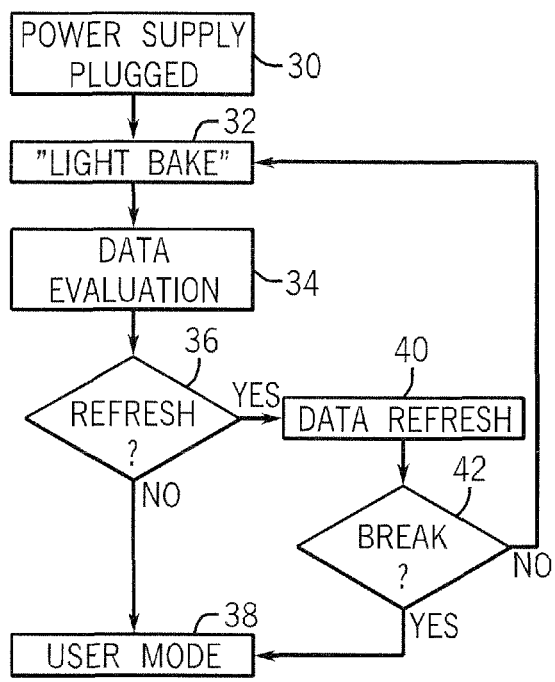
FIG. 2 is a flow chart for an embodiment that is battery powered.

Thus, referring to FIG. 2, in a device which is battery powered or wireless, at block 30 it is determined when a power supply is provided to the system. When the power supply is provided, the bake may be initiated, as indicated at block 32, and the heating is maintained until further notice.

Next, the data that is stored in the memory being treated is read (block 34) after a fixed amount of treatment time with a dedicated reference. If the cells' threshold voltage is too far from a default value, a refresh operation is implemented, as indicated in diamond 36. After this is completed, the device exits from the heating mode and returns to a user mode, as indicated in block 38. If data rewriting is determined to be necessary in diamond 36, then the data may be refreshed, as indicated at block 40, by rewriting the data to a default threshold voltage value. A check at diamond 42 determines if the treatment time window is finished or if a user interrupt has been received. If either of these cases occurs, the system may return to the user mode. Otherwise, the bake continues by returning to block 32.

Figure 3:
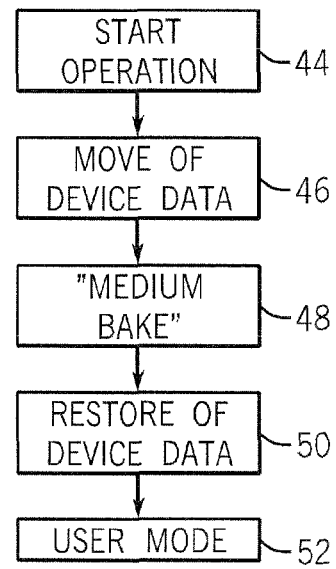
FIG. 3 is a flow chart for an embodiment that is not battery powered.

Referring next to FIG. 3, a sequence for implementing a heating cycle in a flash memory which is not battery powered is illustrated in accordance with one embodiment. At block 44, the operation may start as a result of an operating system routine or a user request. Then, in block 46, the data that is currently stored in the memory to be processed may be moved to another location to preserve the data and to make the data accessible during the memory treatment. For example, the data may be copied to another memory device that will not be treated. Then, in block 48, the memory region or memory to be thermally treated is locked to prevent its use. Then it may be erased (after the bake treatment) and the start of the bake process at a higher temperature (that does not damage the memory) than in the embodiment shown in FIG. 2 may be used. In some embodiments, it is advantageous to thermally treat the memory while it is programmed. Then, if needed, in block 50, the previously stored data that was transferred to another memory pending treatment is restored to the treated memory module.

In some embodiments, the sequences of FIGS. 2 and 3 may be implemented in hardware, software, firmware, or any combination thereof. They may be implemented on the memory 20, but, generally, would be more advantageously implemented on the memory controller 16. In software embodiments, the sequences may be implemented by a sequence of instructions stored on a non-transitory computer readable medium, such as a semiconductor, optical, or magnetic memory.

Figure 4:
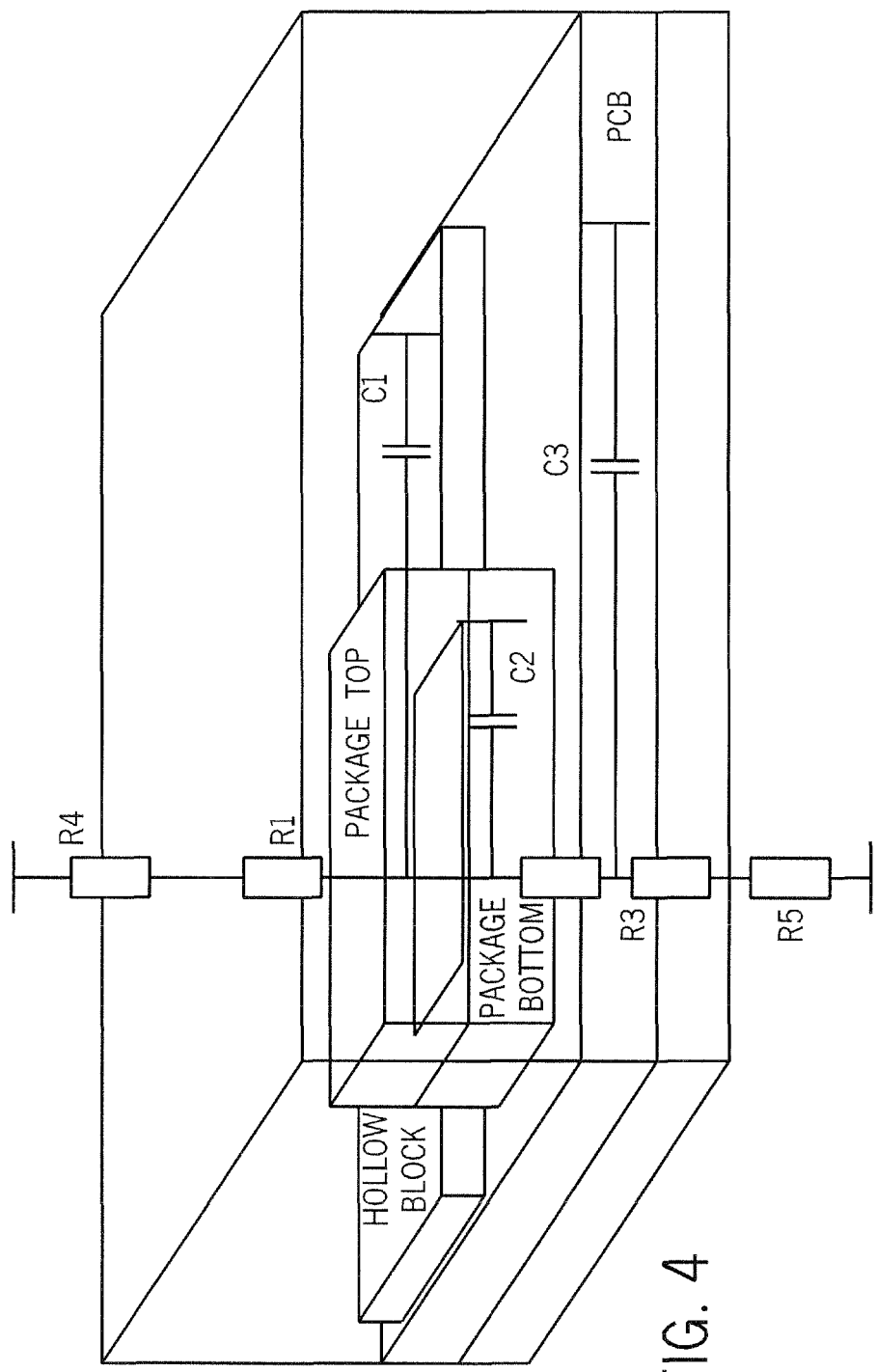
FIG. 4 is a perspective view of a thermal model of a mobile phone case with a memory package inside in accordance with one embodiment.

To estimate the current magnitude and time required to warm up the memory die, a three dimension numerical thermal model of a memory in a mobile phone application was created, as illustrated in FIG. 4. The model represents a mobile phone case with a memory situated on a printed circuit board. The memory block may be situated near to the phone case borders. Better thermal transfer from the memory block means that higher heating current is required.

To estimate the maximum heating current that can be required, the memory block was placed in the lower left part of the phone case, close to its border. The memory package, which may be a ball grid array package, was modeled as two isotropic blocks. Other hypothetical electronic components were modeled by a non-conducting hollow block that has been situated on a printed circuit board. The gravity vector is directed along the z axis and has a reversed sign. The thermal flow through the lateral walls is neglected and adiabatic boundary conditions were assigned to these walls. The bottom and top walls' convection boundary conditions were assigned and applying a constant heat transfer coefficient (e.g. $h=5W/k*m^2$). The dimensions and thermal properties of the materials are as follows:

|  | PCB | Package Top | Package Bottom |
|---|---|---|---|
| Dimensions [mm] | 90 × 40 × 1.6 | 12 × 12 × 0.5 | 12 × 12 × 0.6 |
| Thermal conductivity [K/W] | $K_u = 46$  $K_{in\,plane} = 0.6$ | 3.47 | 0.17 |
| Volume [m³] | $57.6 * 10$ | $0.72 * 10^{-7}$ | $0.864 * 10^{-7}$ |
| Density [kg/m³] | 2000 | 2010 | 2000 |
| Specific heat [J/kg K] | 1100 | 1100 | 1100 |

A heater was applied at the interface between the top and bottom package blocks. Since the heater is located in immediate proximity to the die, their temperatures can be considered equal.

Figure 5:
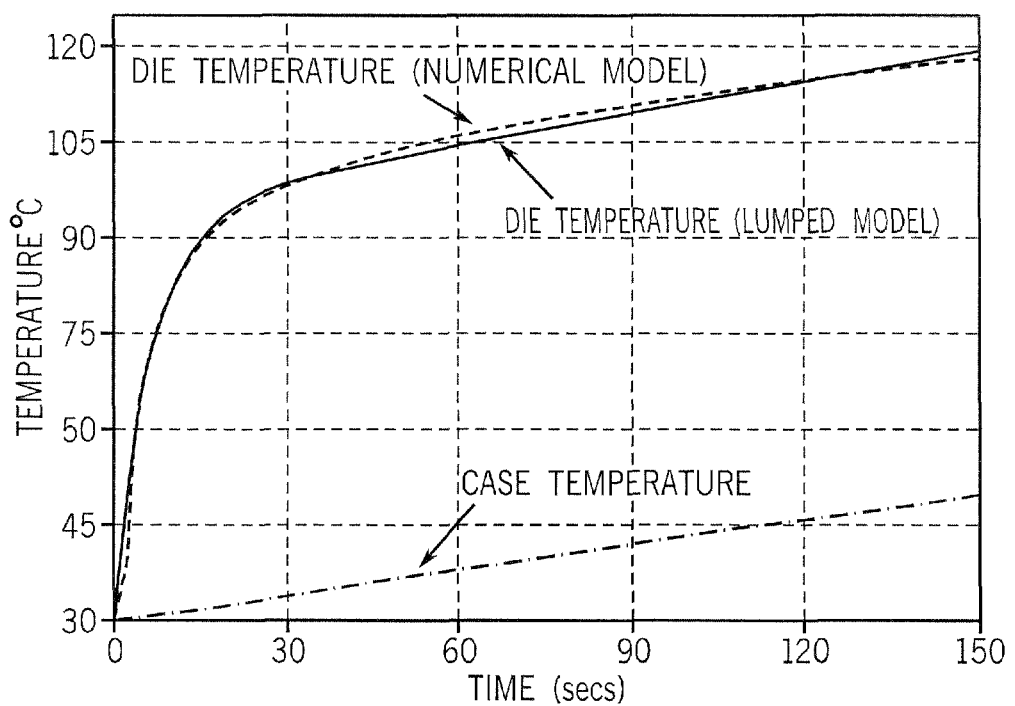
FIG. 5 is a plot of temperature versus time for a simulation without temperature regulator.

In this simulation, the thermal power dissipation of 1.7 watts was applied to the heater. As shown in FIG. 5, a transient simulation for the first 150 seconds, the beginning of the transition temperature increases rapidly and then changes slowly. In the fast part of the transition, the die and case temperatures increase from ambient temperature of 30° C. to 98.5° C. and 33.5° C., respectively.

To better understand the model structure and the origins of the two different slopes of increasing temperature, a lumped thermal model was created, as shown in FIG. 4. For this purpose, a three-dimensional numerical model was represented by an equivalent RC network with corresponding thermal parameters of thermal resistance and thermal capacitance. The convective exchange at the upper or lower case surfaces was modeled by two thermal resistances $R_{th}4$ and $R_{th}5$.

The definition of the thermal capacity is not a trivial problem due to the difficulty in estimating a volume of the heat flow passing through. However, knowing that the thermal capacity is directly proportional to volume, it can be noted that $C_{th}3$ is much greater than $C_{th}1$ or $C_{th}2$. This means that in the beginning of the transition, the whole network will behave as if $C_{th}3$ were a short circuit. Therefore, at the first part of the transition, the time constant is defined as $C_{th}1$ and $C_{th}2$ and has a small value. Then $C_{th}3$ starts charging and the time constant becomes large.

The transient result of the lumped model simulation is shown in FIG. 5.

For a faster transition, the heating and cooling of the memory die may be performed in the first part of the transition when the time constant is small. Both lumped and numerical transition curves show that the fast transition occurs in the first 30 seconds after the heater was turned on. In this time interval, the die is heated to 98.5° C. using the 1.7 watt heater. When the die is required to heat up to a higher or lower temperature, the heat dissipated power can be increased or decreased, respectively.

When the stable temperature or a temperature that vibrates around an equilibrium point is required, current supply regulation can be implemented in one embodiment. The heater may be warmed up to 100° C. and the temperature may be kept with a precision of 5° C., for example. Thus, once the temperature of 105° C. is reached, the heater can be turned off until the temperature drops to 95° C., when it is turned on again until the temperature reaches 105° C. The transition characteristic of such a power management system is shown in FIGS. 6 and 7.

Figure 6:
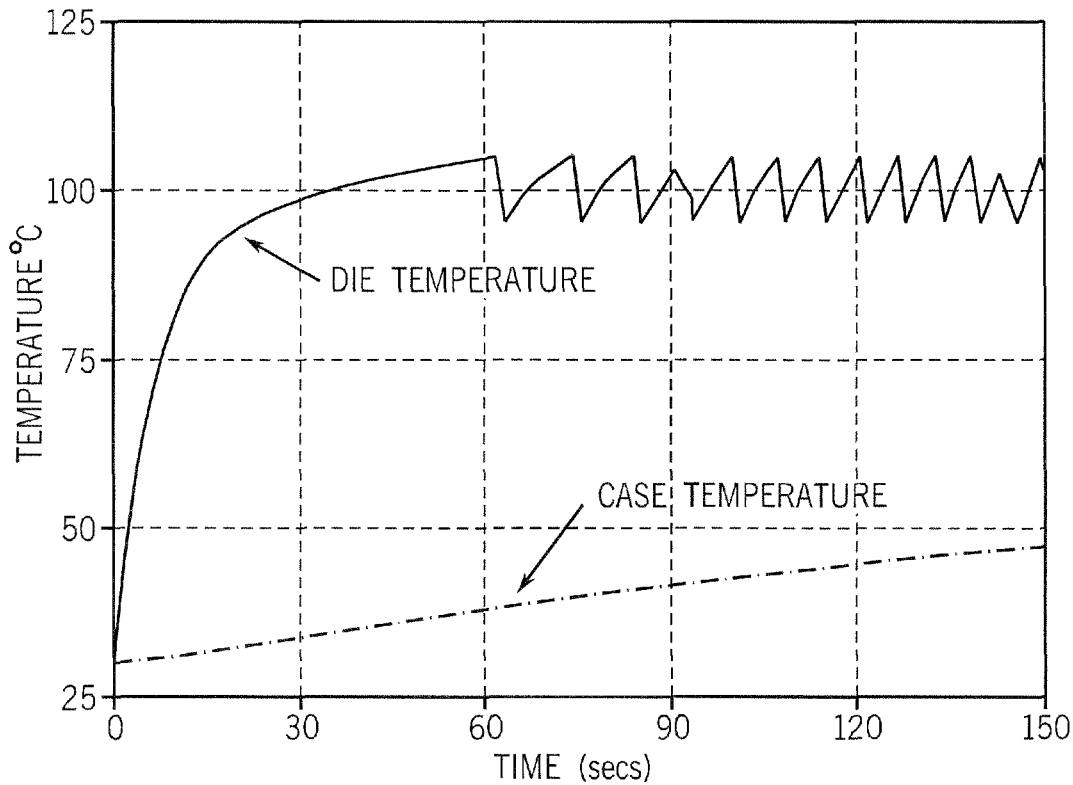
FIG. 6 is a graph of temperature versus time for the first 150 seconds of a transient analysis with temperature regulator.
Figure 7:
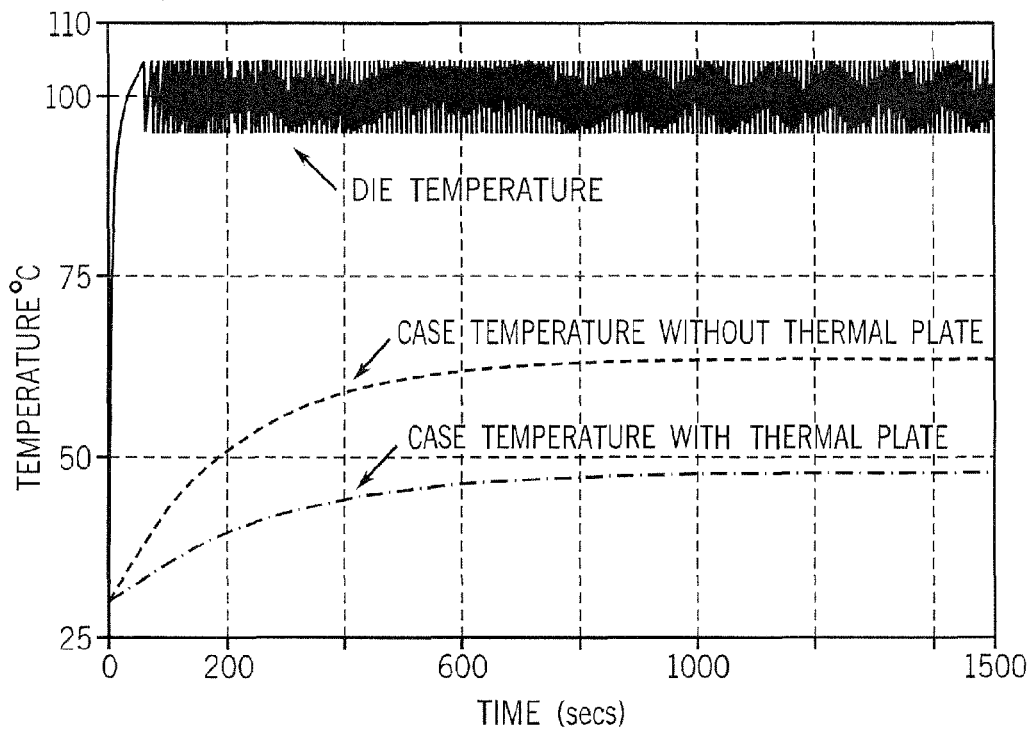
FIG. 7 is a graph of temperature versus time for the first 1500 seconds of the transient analysis with temperature regulator.

In FIG. 6, showing the first 150 seconds, the die temperature is kept up at about 105° C. In FIG. 7, the transient analysis for the first 1500 seconds is shown. The steady state regime is achieved in about twenty minutes. The plot shows the case temperature without and with a thermal plate, respectively, as well as the die temperature.

Figure 8:
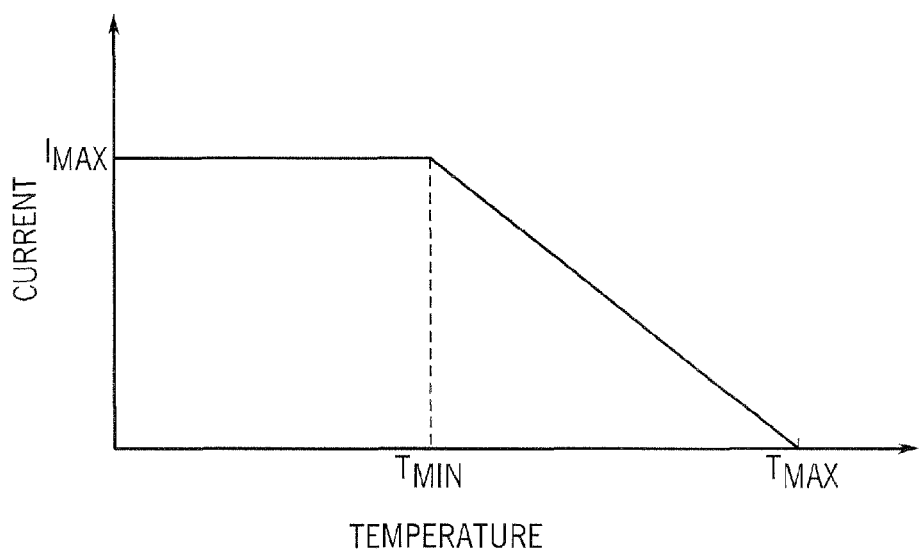
FIG. 8 is a graph of current versus temperature with temperature regulator showing the current supplied as a function of temperature in accordance with one embodiment.

To reduce the temperature range and the frequency of switching, an alternate solution can be implemented. Instead of the switch that is turned on when the temperature reaches the low level and is turned off at the high level, the current is regulated by the temperature of the heater. At the beginning when the temperature is lower than the minimum value ($T_{min}$), the current supplied is the maximum available ($I_{max}$), as shown in FIG. 8. When the minimum temperature is achieved, the current decreases as a linear function of temperature until, eventually, a maximum value is reached and the current supplied is turned off.

Keeping the die temperature up to about 100° C., the steady state regime is reached in about twenty minutes and the more warmed bottom wall of the phone case assumes the temperature of 63.3° C. When demanded, the time of die heating is comparable with the steady state regime being reached and additional measures to decrease the case temperature may be used.

The case temperature can be decreased by introducing an additional thermal resistance between the printed circuit board and the bottom of a thermal case. Introduction of this resistance offers two advantages in some embodiments. Firstly, the case temperatures were considerably lower and, secondly, less electrical power is required for die warming and, thereby, lower current can be used to obtain the same temperature of the die. This resistance may be achieved as a plate with high thermal resistance placed between the board and the phone case. This plate may be placed and removed mechanically, for example, when a battery charger is connected to or disconnected from the phone.

The heater may be made as a resistance situated under the die. As another alternative, the resistance may use substrate copper trace elements. Currently technology techniques permit obtaining a 15 micron thick and 25 micron wide copper trace with 25 micron spaces between two spaces. The heat dissipation can be obtained in accordance with Joule's law as the square of the current through the resistance. For such a heater, with an area of 5×5 millimeter square, the resistance of 22.9 Ohms can be obtained. Applying a current of 0.2 amps to this resistance, the heat dissipation of 0.9 watts will be obtained. Any necessary current can be provided from the phone adapter during charging time. The higher dissipated power can be obtained using a higher current or a bigger heater area.

References throughout this specification to "one embodiment" or "an embodiment" mean that a particular feature, structure, or characteristic described in connection with the embodiment is included in at least one implementation encompassed within the present invention. Thus, appearances of the phrase "one embodiment" or "in an embodiment" are not necessarily referring to the same embodiment. Furthermore, the particular features, structures, or characteristics may be instituted in other suitable forms other than the particular embodiment illustrated and all such forms may be encompassed within the claims of the present application.

While the present invention has been described with respect to a limited number of embodiments, those skilled in the art will appreciate numerous modifications and variations therefrom. It is intended that the appended claims cover all such modifications and variations as fall within the true spirit and scope of this present invention.

What is claimed is:

1. A method comprising:
   heating a memory;
   reading data stored in the memory; and
   measuring a temperature of the heater, wherein a maximum available amount of current is generated in a heater for heating the memory if the temperature is lower than a temperature range.

2. The method of claim 1, further comprising copying the data stored in the memory to a second memory before heating the memory.

3. The method of claim 1, further comprising coupling the memory to an external power supply.

4. The method of claim 1, wherein heating the memory is initiated by a triggering event.

5. The method of claim 4, wherein the triggering event is a user command.

6. The method of claim 1, wherein heating the memory includes heating only marked blocks within the memory.

7. The method of claim 6, wherein the marked blocks are marked based on an age of the marked blocks.

8. The method of claim 1, further comprising tracking an age of blocks within the memory, wherein the age is measured from a prior heating of the memory.

9. The method of claim 1, wherein the temperature range is from 120 degrees Celsius to 150 degrees Celsius.

10. An apparatus comprising:
    a package surrounding a memory circuit; and
    a heater within the package, wherein the heater is configured to generate a maximum available current when a temperature of the heater is lower than a temperature range.

11. The apparatus of claim 10, wherein the memory circuit comprises a multi-block memory.

12. The apparatus of claim 11, wherein the heater is configured to heat specific marked blocks of the multi-block memory.

13. The apparatus of claim 10, wherein the package includes a temperature probe configured to detect the temperature of the heater.

14. The apparatus of claim 10, further comprising a battery coupled to the heater and configured to provide power to the heater.

15. The apparatus of claim 10, wherein the heater is configured to be coupled to an external power supply.

16. An apparatus comprising:
    a memory controller;
    a memory coupled to the memory controller;
    a heater configured to heat the memory; and
    a temperature controller coupled to the memory controller, the temperature controller configured to provide signals to cause heating of the memory, wherein the signals cause a maximum available current to be applied to the heater when the heater is lower than a temperature range.

17. The apparatus of claim 16, wherein the memory controller is configured to sense when external power is supplied, and responsive to detecting the supply of external power, to trigger the temperature controller to generate the signals to cause heating of the memory.

18. The apparatus of claim 16, wherein the memory controller is configured to deactivate the memory and prevent user access responsive to heating of the memory.

19. The apparatus of claim 16, wherein the heater comprises resistive copper trace elements.

20. The apparatus of claim 19, wherein the resistive copper trace elements are located within the memory.

* * * * *